United States Patent
Dankelmann et al.

(10) Patent No.: US 9,565,769 B2
(45) Date of Patent: *Feb. 7, 2017

(54) LED LINEAR LIGHTING KIT

(71) Applicant: Elemental LED, Inc., Emeryville, CA (US)

(72) Inventors: Andreas Dankelmann, Emeryville, CA (US); Randall Holleschau, Emeryville, CA (US)

(73) Assignee: Elemental LED, Inc., Emeryville, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/707,962

(22) Filed: May 8, 2015

(65) Prior Publication Data

US 2015/0241034 A1    Aug. 27, 2015

Related U.S. Application Data

(63) Continuation-in-part of application No. 14/184,475, filed on Feb. 19, 2014.

(51) Int. Cl.

| *F21S 4/00* | (2016.01) |
|---|---|
| *H05K 1/18* | (2006.01) |
| *F21V 15/01* | (2006.01) |
| *F21V 21/02* | (2006.01) |
| *F21V 3/04* | (2006.01) |
| *F21V 15/015* | (2006.01) |
| *F21Y 113/00* | (2016.01) |
| *F21Y 101/00* | (2016.01) |

(52) U.S. Cl.
CPC ............... *H05K 1/189* (2013.01); *F21S 4/28* (2016.01); *F21V 15/013* (2013.01); *F21V 21/025* (2013.01); *F21V 3/049* (2013.01); *F21V 15/015* (2013.01); *F21Y 2101/00* (2013.01); *F21Y 2103/10* (2016.08); *F21Y 2113/00* (2013.01); *F21Y 2115/10* (2016.08); *Y10T 29/49002* (2015.01)

(58) Field of Classification Search
CPC .............. F21S 4/20; F21S 4/28; F21V 15/013; F21V 21/025

See application file for complete search history.

(56) References Cited

U.S. PATENT DOCUMENTS

| 4,994,944 | A | | 2/1991 | Vernondier | |
|---|---|---|---|---|---|
| 5,430,627 | A | * | 7/1995 | Nagano | ................... F21S 4/003 362/146 |

(Continued)

*Primary Examiner* — Andrew Coughlin
*Assistant Examiner* — Alexander Garlen
(74) *Attorney, Agent, or Firm* — PatentBest; Andrew McAleavey

(57) ABSTRACT

An LED lighting kit comprises an extrusion (300), an LED strip (100), a tapered wedge (1500), and a mounting clip (1200). The extrusion itself may have a recessed linear groove of sufficient width and depth to seat the LED strip. The clip is sized and shaped to springably engage ledges (320) in a first channel (310) of the extrusion when the strip is mounted. In one aspect, two extrusions are butted end-to-end and are aligned by inserting the tapered wedge into the first channel of each extrusion prior to butting them together. The extrusion contains a second channel (315) that houses the LED strip. A translucent diffuser (900) is springably inserted into the second channel, thereby diffusing light that is emitted by the LED strip.

22 Claims, 4 Drawing Sheets

(56) References Cited

U.S. PATENT DOCUMENTS

| | | | |
|---|---|---|---|
| 5,730,544 A | 3/1998 | Dils et al. | |
| 5,758,987 A | 6/1998 | Frame et al. | |
| 7,033,060 B2 | 4/2006 | Dubuc | |
| 7,207,696 B1 | 4/2007 | Lin | |
| 8,287,144 B2 | 10/2012 | Pedersen et al. | |
| 2003/0016992 A1 | 1/2003 | Layfield | |
| 2003/0021115 A1 | 1/2003 | Sloan et al. | |
| 2003/0210546 A1 | 11/2003 | Chin | |
| 2006/0146540 A1 | 7/2006 | Reo et al. | |
| 2007/0047229 A1 | 3/2007 | Lee | |
| 2008/0007945 A1* | 1/2008 | Kelly | A47F 3/001 362/218 |
| 2008/0037239 A1* | 2/2008 | Thomas | F21S 4/008 362/92 |
| 2009/0190350 A1* | 7/2009 | Tseng | F21S 2/005 362/249.01 |
| 2010/0271804 A1 | 10/2010 | Levine | |
| 2011/0007503 A1 | 1/2011 | Caron et al. | |
| 2011/0164417 A1* | 7/2011 | Huang | F21V 7/0008 362/235 |
| 2011/0286207 A1 | 11/2011 | Chan et al. | |
| 2012/0002406 A1 | 1/2012 | Leadford et al. | |
| 2013/0094225 A1 | 4/2013 | Leichner | |
| 2013/0301256 A1* | 11/2013 | Thomas | F21V 21/00 362/224 |

* cited by examiner

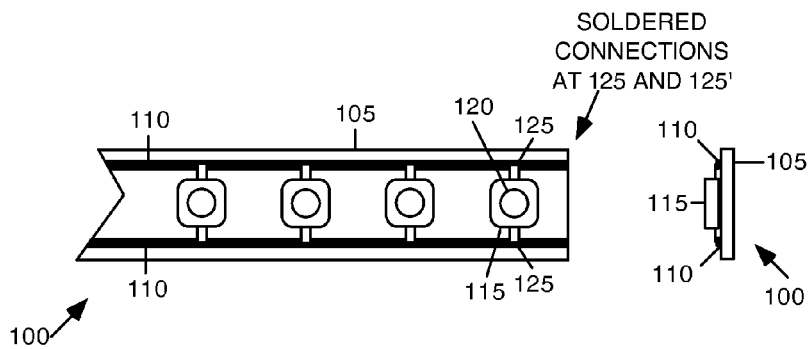
Fig. 1--Prior Art    Fig. 2--Prior Art
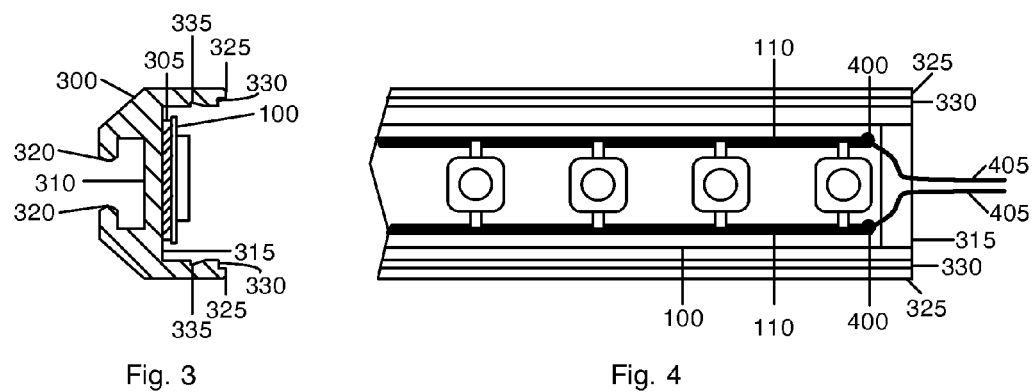
Fig. 3    Fig. 4
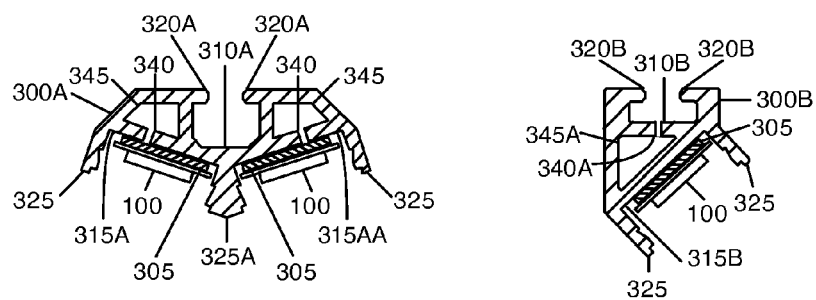
Fig. 5    Fig. 6

LED LINEAR LIGHTING KIT

CROSS-REFERENCE TO RELATED APPLICATIONS

This application is a continuation-in-part of U.S. patent application Ser. No. 14/184,475, filed Feb. 19, 2014. This application is also related to copending application Ser. No. 13/967,017 of Russell Petersen et al., filed Aug. 14, 2013.

BACKGROUND

Prior Art

Light-emitting diode (LED) lighting systems are in common use today. They offer improved electrical efficiency when compared with incandescent and fluorescent lighting. Individual LED lights are relatively small, ranging in size from a fraction of one millimeter for a single LED to an array of smaller LEDs that is a square centimeter or more. Such lights incorporate lenses, reflectors, phosphors, and diffusers that influence the size, shape, and appearance of light output.

Prior-art LEDs are often sold in groups formed into a strip configuration that can have any length. These are often seen as flexible strands of lights used in holiday decorations, advertising, and emergency lighting. Other arrangements include flexible, rigid or semi-rigid printed circuit boards (PCBs) to which are affixed series of LEDs. The PCBs are mounted into tracks that can be secured to surfaces, such as walls, the undersurface of kitchen cupboards, and the like. The tracks are available in various predetermined lengths, which can be joined end-to-end to form a continuous lighting arrangement of a desired length.

The following is a list of some possibly relevant prior art that shows the joining of LED light strips in order to form a lighting strip of predetermined length.

| Patent or Pub. Nr. | Kind Code | Issue or Pub. Date | Patentee or Applicant |
|---|---|---|---|
| U.S. Pat. No. 4,994,944 | B1 | 1991-02-19 | Vernondier |
| U.S. Pat. No. 7,033,060 | B2 | 2006-04-25 | Dubuc |
| US 2010/0271804 | A1 | 2010-10-28 | Levine |
| US 2011/0007503 | A1 | 2011-01-13 | Caron et al. |
| US 2011/0286207 | A1 | 2011-11-24 | Chan et al. |
| US 2012/0002046 | A1 | 2012-01-05 | Leadford et al. |
| US 2013/0094225 | A1 | 2013-04-18 | Leichner |

Vernondier shows variations on an extruded housing for a light strip. The housing comprises a base portion that houses a light strip and a translucent cover that removably snaps into the base portion by springably urging projections 20 and 21 past projections 15 and 16. He also goes into detail about the electrical connections of the strips and between strips. His strips are joined with a gasket into which the ends of two strips are inserted.

Dubuc shows a light strip for supplementing natural light in a greenhouse. A narrow attachment rail is used to suspend a strip of LEDs from the frame structure of the greenhouse. Strips of LEDs are mounted in a support rail ("carrier") made of extruded aluminum. The carrier has a base, a channel for receiving the light strip, and at least two pair of external ribs that define at least one mounting slot.

Levine shows a modular lighting device kit that includes first and second elongated light-source modules that contain LEDs. One or more clips hold the light-source modules in place a predetermined distance from a mounting surface. The modules can be rotated 360-degrees in the mounting clips.

Caron shows a valence lighting fixture that can be daisy-chained. The fixture comprises an elongated housing member and has a substantially square-shaped cross-section with up to three translucent sides from which light emanates. A mounting bracket removably snaps into a mounting groove for securing the fixture to a surface.

Chan shows a linear LED light module that interfaces with other modules to provide a substantially continuous array of LEDs. The LED strips are held against a mounting plate by a plurality of spring clips that engage the strips. Another spring clip mounting method is shown in which the clips reach downward from the top of the strip. An alternative rod mount permits mounting the strip on a rod so that it can be rotated to allow for adjustment of the light output at different angles.

Leadford shows a slidable luminaire connector. One or more rails contain a plurality of LEDs (or other light source). One or more rails slidably engages a node that provides power and operating signals for the LEDs.

Leichner shows a modular, sectional linear LED lighting system that comprises a linear arrangement that is hung by a variety of means—hung from a cord,—rigidly attached to a surface, and hung from an aircraft cable. A surface mounting attachment slidably engages a mating T-slot on the body and then engages a bracket that is mounted to a surface. Sections are joined by brackets that align the vertical and horizontal axis of the end-to-end connection as well as pull the extrusions tightly together.

While the above prior-art contains lighting strips of various kinds, all require seams or are not removable from their mounting surface.

SUMMARY

We have discovered a method and apparatus for joining and mounting a plurality of contiguously arranged linear LED light strips. A plurality of mounting clips are attached to a surface and a plurality of LED light strips are springably secured to the mounting clips. A wedge-shaped extrusion connector inserted into neighboring light strips aligns sequentially placed light strips and provides rigidity to their installation, even across gaps in the mounting surface. The extrusions in which the LED light strips are mounted may include recessed open grooves approximately the same width as the LED light strips.

Other aspects, features, and advantages of the invention will be set forth in the description that follows.

DRAWING FIGURES

The invention will be described with respect to the following drawing figures, in which like numerals represent like features throughout the description, and in which:

FIGS. 1 and 2 are plan and end views, respectively, of one end of a prior-art PCB LED light strip;

FIG. 3 is a cross-sectional end view of a linear light fixture according to one aspect of an embodiment;

FIG. 4 is a plan view of the fixture of FIG. 3;

FIGS. 5 and 6 show alternative cross-sectional end views of the fixture of FIGS. 3 and 4;

REFERENCE NUMERALS

Figure 7:
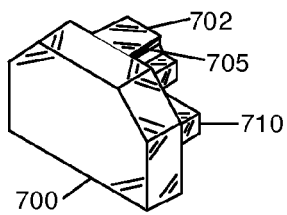
FIGS. 7 through 10 show perspective and cross-sectional views of additional components used in one embodiment.

| | | | |
|---|---|---|---|
| 100 | Prior art PCB LED light strip | 105 | Light strip board |
| 110 | Conductor | 115 | LED assembly |
| 120 | Light-emitting portion | 125 | Connection |
| 300 | Extrusion | 305 | Adhesive |
| 310 | Channel | 315 | Channel |
| 320 | Ledge | 325 | Side |
| 330 | Lip | 335 | Groove |
| 340 | Gap | 345 | Channel |
| 400 | Solder joint | 405 | Wire |
| 700 | Cap | 702 | First portion |
| 705 | Thickened portion | 710 | Second portion |
| 800 | Cap | 805 | Hole |
| 900 | Diffuser | 905 | Portion |
| 910 | Arm | 912 | Projection |
| 915 | Arrow | 1200 | Clip |
| 1205 | Base | 1210 | Member |
| 1215 | Main portion | 1220 | Auxiliary portion |
| 1225 | Bight | 1230 | Mounting Hole |
| 1300 | Mounting Surface | 1500 | Wedge |
| 1505 | Portion | 1507 | Portion |
| 1510 | Center point | | |

DESCRIPTION

Prior Art LEDs and Light Strips—FIGS. 1 and 2

FIGS. 1 and 2 show a plan and end views, respectively, of one end of a prior-art PCB (printed circuit board) LED light strip 100. Individual LED assemblies such as 115 are mounted on a printed circuit board 105 made of an insulating material, such as fiberglass, phenolic plastic, etc., that has printed conductors 110 thereon. Board 105 is either rigid or flexible. Conductors 110 extend down the length of strip 100, are typically made of copper, and are securely bonded to board 105 in well-known fashion.

Board 105 holds a row of LED assemblies 115, each having a central light-emitting portion 120 and at least two electrical connections 125. The LED assemblies are bonded to strip 100 using an adhesive compound (not shown) between the underneath surface of each assembly and board 105 and connections 125 are soldered to conductors 110 (FIG. 1), respectively, using well-known reflow soldering methods. The combination of the adhesive and solder bonds firmly secures the LED assemblies to board 105.

The semiconductor junctions that form the LEDs produce light when energized by a limited, direct-current potential source. Excessive currents or reverse potentials can cause failure of a device. Because of this, LED assemblies contain well-known current limiting circuitry, such as a resistor or current-limiting integrated circuit (not shown). If they are to be operated by an alternating current source, they also contain a rectifier (not shown) to prevent application of a reverse potential to the junction of the device.

The length of LED strip 100 can be short and include from one LED assembly 115 to several, or it can be very long and include many LED assemblies 115. In some applications a plurality of strips 100 are joined together, end-to-end. In all applications, it is necessary to apply electrical power to strip 100 in order to energize it. In many applications, this is done by soldering wires to conductors 110.

First Embodiment—FIGS. 1 through 12C

FIGS. 3 through 12C show the elements of a linear LED lighting kit according to one aspect of a first embodiment. A linear LED lighting kit includes all components necessary to assemble a finished light fixture that is attachable to a surface. Such kits are found in under-cabinet lighting in kitchens, in display cases, in accent and emergency lighting for rooms, and the like.

Fixture. FIG. 3 is a cross-sectional end view of an extrusion 300 comprising first and second open channels 310 and 315, respectively. Channel 310 is bounded by a pair of ledges 320 and channel 315 is bounded by a pair of sides 325. A light strip 100 is secured within channel 315 by a layer of adhesive 305. Sides 325 further include inner lips 330 and grooves 335 that are used in securing a light diffuser or lens, as described below.

FIG. 4 is a top view of extrusion 300 as it is shown in FIG. 3. A pair of solder joints 400 secure and electrically connect a pair of insulated wires 405 to electrical conductors 110 of strip 100. Wires 405 are then connected to a source of power when strip 100 is to be energized.

FIGS. 5 and 6 show alternative versions of extrusion 300 that are used when light is to be directed at various angles with respect to the plane of a mounting surface (shown below). FIG. 5 shows a design that directs light from LED strips 100 and 100A at two angles with respect to a mounting surface. Extrusion 300A includes a first open channel 310A, similar to open channel 310 in extrusion 300 (FIG. 3) and two open channels 315A and 315AA that face in a direction generally opposite that of channel 310A. Extrusion 300A further includes sides 325, lips 330, and notches 335, similar to those shown in FIG. 3. At the center of extrusion 300A, two lips 325 are joined into a single lip 325A. LED strips 100 and adhesives 305 are the same as shown in FIG. 3.

FIG. 6 shows another alternative extrusion 300B with channels 310B and 315B, LED strip 100 and adhesive 305, similar to those shown in FIGS. 3 and 5. FIGS. 5 and 6 show gaps 340 and 340A, respectively, in extrusions 300A and 300B. These gaps are used in the extrusion process for the formation of channels 345 and 345A, respectively. Many variations of extrusions 300 are possible.

Figure 12A:
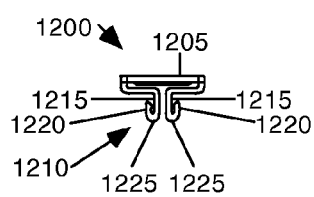
FIGS. 12A through 12C show end, side, and bottom views of a mounting clip for use with the embodiments of FIGS. 3 through 11.
Figure 12B:
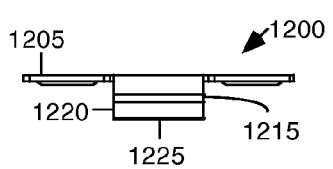
Figure 12C:
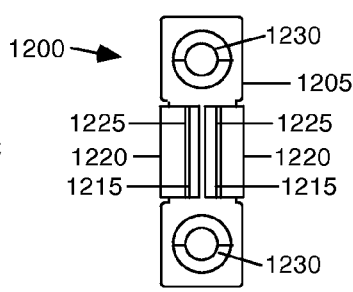

Channels 310 are shown as having different depths in FIGS. 3, 5, and 6. The depths of these channels are not critical as long as they are able to accommodate members 1210 of mounting clip 1200, as discussed below (FIGS. 12A-12C). The spacing between lips 325 is determined by the combined width and spacing of members 1210 of mounting clip 1200, as shown below.

Extrusions 300 are made of aluminum, although they can be plastic, another metal such as brass, hard rubber, or another substance that is extrudable and forms a rigid structure. Channels 315 are 1.5 cm wide, although other widths can be used. The relative sizes of the remaining portions of extrusions 300 are scaled approximately as indicated in the drawings. Extrusions 300 vary in length from about 5 cm to one meter or more, depending on the requirements of any particular installation. Adhesive 305 is two-sided tape, although a liquid adhesive that forms a bond between channel 315 and the back side of strip 100 can be used.

Figure 8:
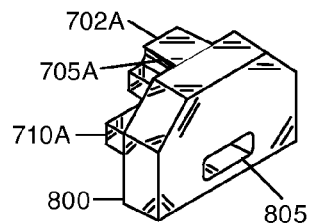

FIGS. 7 through 10 show additional components used in the linear LED lighting kit. FIGS. 7 and 8 are perspective views of end caps 700 and 800, respectively without and with a hole 805. Caps 700 and 800 provide closures for covering the ends of extrusions 300. Caps 700 and 800 include first wedge-shaped or tapered portions 702 and 702A, respectively, which have gradually thickened, tapered portions 705 and 705A, respectively. The first tapered portions 702 and 702A are slidably inserted into channel 310 of extrusion 300. Second portions 710 and 710A, respectively, are slidably inserted into channel 315 of extrusion 300 at the same time. As end caps 700 and 800 are urged into channels 310 and 315, thickened portions 705 wedge against ledges 320 of extrusion 300 (FIG. 3), while portions 710 prevent misalignment or rotation of end caps 700 and 800 around portions 710, thereby firmly securing end caps 700 and 800 in place on extrusion 300. Wires 405 (FIGS. 4 and 11) are connected to conductors 110 of light strip 100 by solder joints 400, passed through hole 805, and connected to a power source (not shown) for energizing light strip 100.

Figure 9:
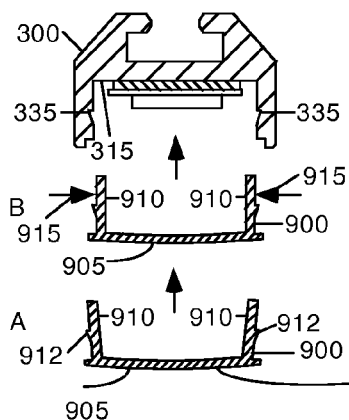
Figure 10:
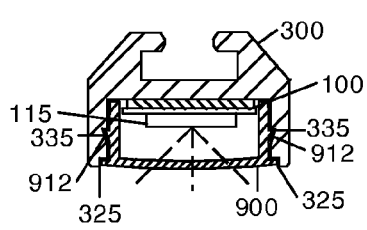

FIGS. 9 and 10 are cross-sectional end views of extrusion 300 and a lens or diffuser (diffuser) 900. Diffuser 900 has a light-emitting portion 905 and two arms 910 that are tilted away from each other, as shown at position A, by between 1 and 5 degrees, although other angles can be used.

Arms 910 further contain two outward-facing projections. Diffuser 900 is slightly flexible, allowing fingers 910 to be pinched together as indicated by horizontal arrows 915 when diffuser 900 is at position B. When the diffuser is to be installed in extrusion 300, fingers 910 are pinched together and diffuser 900 is slidably inserted into channel 315 of extrusion 300.

FIG. 10 shows diffuser 900 in place in extrusion 300. Projections 912 are springably held in notches 335 and the edges of surface 905 rest in grooves 325 of extrusion 300. Dashed lines indicate the passage of light from LED assembly 115 outward through diffuser 900 when light strip 100 is energized. Diffuser 900 is made of polycarbonate, acrylic, or another plastic or glass. It is clear or translucent and its surface can be plain or lenticular (having lenticles). It can have a lens shape or comprise other light-guiding means such as a privacy filter manufactured by Minnesota Mining and Manufacturing Co., of Minneapolis, Minn. and sold under the trademark "3M Privacy Filters". The lens or other light guiding means can be formed into the diffuser's surface in order to direct light from LED assembly over a predetermined area at a predetermined distance from the diffuser. The diffuser can also be made in colors.

Figure 11:
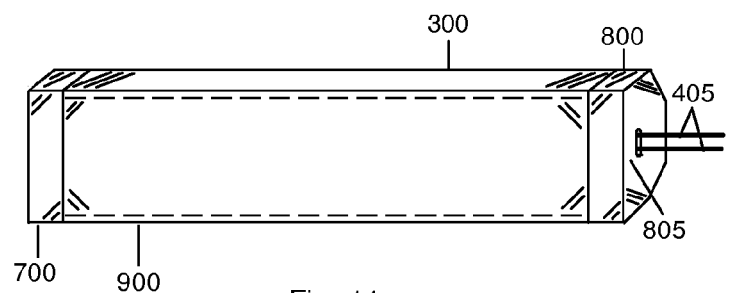
FIG. 11 shows a perspective view of a finished light kit according to one aspect of an embodiment.

FIG. 11 shows a finished light kit according to one aspect of the present embodiment. End caps 700 and 800 and diffuser 900 are installed in extrusion 300. Wires 405 are passed through hole 805 and ready for connection to a power source.

Mounting Clip. FIGS. 12A through 12C, respectively, show end, side, and bottom views of a mounting clip 1200 that is used with extrusions 300. Mounting clip 1200 comprises a flat base portion 1205, a pair of flexible members 1210 having a main portion 1215 extending downward from base portion 1205, and an auxiliary portion 1220 that extends upward and generally parallel to main portion 1215. Main portion 1215 and auxiliary portion 1220 are joined by a bight portion 1225. Flat base portion 1205 includes at least one hole 1230 through which a fastener (not shown) is passed when clip 1200 is secured to a mounting surface.

Clip 1200 is made of a metal such as steel, brass, or bronze, or a strong plastic material such as reinforced nylon. Flexible members 1210 are sized to be slidably inserted or urged into channel 310 of extrusion 300. The dimensions of the remainder of clip 1200 scales accordingly.

Figure 13:
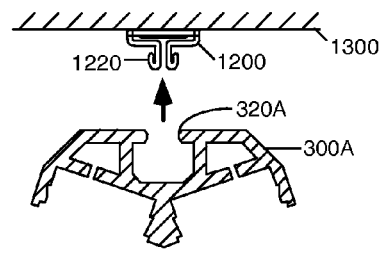
FIGS. 13 and 14 show cross-sectional end views of the mounting of an embodiment of a LED linear lighting kit.
Figure 14:
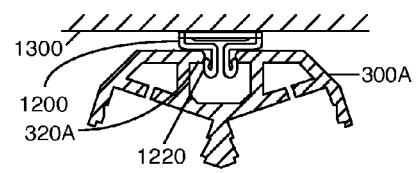

Operation—Installation: Attaching LED Linear Lighting Kit to Surface—FIGS. 13-17C. FIGS. 13 and 14 show emplacement of the LED linear light kit according to one aspect of the present embodiment. FIGS. 13 and 14 show a cross-sectional view of an extrusion 300A in the present example. In some cases extrusion 300 is installed on a clip 1200, followed by installation of a light strip 100, wires 405, and end caps 700 and 800. In other cases a completed light fixture such as shown in FIG. 11 is installed. In both cases, the attachment of extrusion 300 to clip 1200 is done in the same way. Other extrusions, such as 300 and 300B, can be used, as well as any others that have an open channel 310 of a predetermined depth and spacing between ledges 320.

FIG. 13 shows a mounting surface 1300 such as a ceiling, wall, or the underside of a cabinet to which a clip 1200 has been secured by fasteners, tape, glue, or other means (not shown). An extrusion 300A is positioned beneath clip 1200 and urged upward as indicated by the arrow at the center of FIG. 13. Ledges 320A engage auxiliary portions 1220 of clip 1200, springably squeezing portions 1200 together as extrusion 300A moves upward.

FIG. 14 shows extrusion 300A fully installed on clip 1200. Auxiliary portions 1220 of clip 1200 are springably urged outward against ledges 320A, thereby firmly securing extrusion 300A to clip 1200. For very short LED lighting kit fixtures, on the order of 10 cm long, a single clip 1200 suffices. For longer fixtures, a plurality of clips 1200 is used.

Joining of Two LED Lighting Kits that are Arranged End-to-End. FIGS. 15 through 17C show how two lighting kits are joined with their butted ends aligned.

Figure 15A:
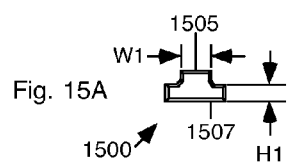
FIGS. 15A through 15C show end, side, and bottom views, respectively, of a dual-tapered wedge used to join two lighting fixtures.
Figure 15B:
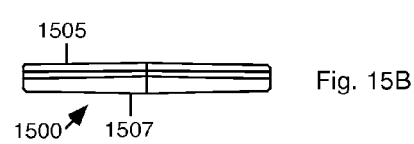
Figure 15C:
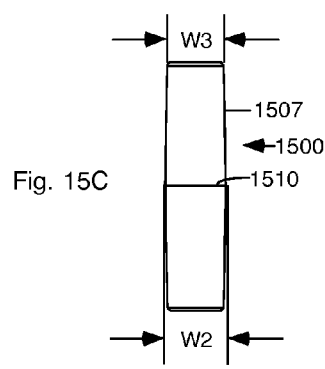
Figure 16:
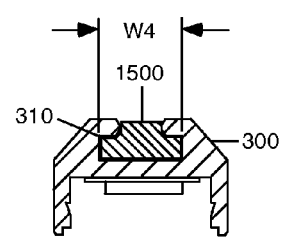
FIG. 16 is a cross-sectional end view of the wedge of FIG. 15 installed in a light kit extrusion.

FIGS. 15A through 15C show end, side, and bottom views, respectively, of a double-tapered wedge 1500 that is used to join two lighting kits end-to-end. Wedge 1500 has a top portion 1505 of width W1 that is sized to slidably insert between ledges 320 in any of extrusions 300. Wedge 1500 has a bottom portion 1507 with height H1 that is sized to slidably fit in channel 310 of any of extrusions 300. Wedge 1500 is symmetric about a center point 1510 where the width of wedge 1500 is W2. At its ends, the width of wedge 1500 is W3. Width W3 is slightly less than the width W4 of channel 310 of extrusion 300 (FIG. 16). Width W2 is slightly larger, approximately 0.5 mm more, than width W4 of channel 310. Thus wedge 1500 can be slidably inserted half-way into channel 310, up to a point near center point 1510, but no more because it is stopped by interference between the two widths. Wedge 1500 is made of plastic, metal, or wood.

FIG. 16 is a cross-sectional view of wedge 1500 after insertion into channel 310 of extrusion 300.

Figure 17A:
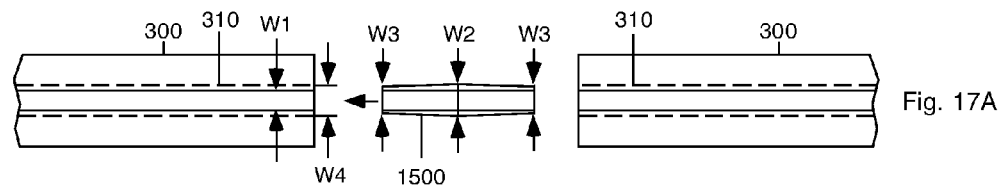
FIGS. 17A through 17C show the aligning and end-to-end butt joining of two lighting fixture extrusions.
Figure 17B:
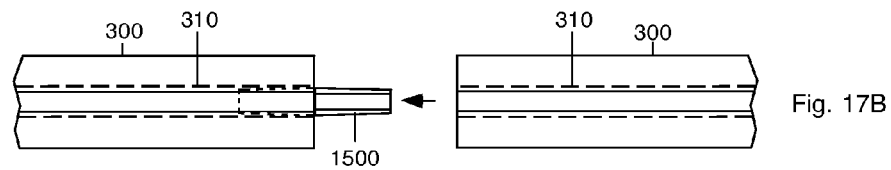
Figure 17C:
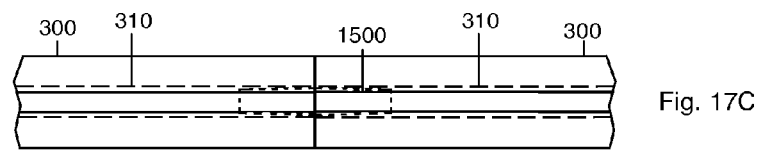

FIGS. 17A through 17C show top views of two extrusions 300 in preparation for a butting assembly in order to form a light fixture of extended length. In FIG. 17A, wedge 1500 is positioned for slidable insertion into channel 310 of the left-hand extrusion 300. W3 is less than W4 so wedge 1500 can enter channel 310 of extrusion 300. However W2 at the mid-point of wedge 1500 is slightly greater than W4 so wedge 1500 cannot be inserted past the mid-point of wedge 1500.

FIG. 17B shows the left half of wedge 1500 inserted in channel 310 of the left-hand extrusion 300. Next, the right-hand extrusion 300 is urged leftward toward the left-hand extrusion 300. The two extrusions are aligned so that the right half of wedge 1500 will enter channel 310 of extrusion 300 as the two extrusions are urged together lengthwise.

FIG. 17C shows left-hand and right-hand extrusions 300 butted together, aligned by wedge 1500. The alignment of two extrusions results in a pleasing appearance when the extrusions are butted together.

Left-hand and right-hand extrusions 300 can be joined with wedge 1500 either before or after being secured to mounting surface 1300 (FIGS. 13 and 14). In the latter case, the two extrusions can be positioned with their ends to be joined separated by at least the length of wedge 1500. A first end of wedge 1500 is then inserted into a first extrusion and the two extrusions are slidably moved together as the second end of wedge 1500 is inserted into a second extrusion, while both extrusions remain mounted on clips 1200.

End caps 700 and 800 are not used at the butt joint, but can be used at the free ends (not shown in FIGS. 17) of extrusions 300. A single LED strip 100 can be installed across the butt joint from one extrusion to the other with conductors 110 (FIG. 1) running continuously across the joint.

Alternatively two of strips 100 can be used, one for each of extrusions 300, with wiring at the free ends of extrusions 300.

One difficulty with using the kind of extrusions 300 described above is that the extrusion is typically much wider than the LED strip 100 itself. Thus, it can be difficult to lay the LED strip 100 down in the extrusion in a straight line. This, in turn, can give the assembled lighting fixture an uneven appearance and may introduce stresses on the LED strip 100 and its substrate. Moreover, while adhesive 305 may bond the LED strip 100 to the extrusion 300, it does not address the issue of keeping the LED strip 100 in a straight line.

Figure 18:
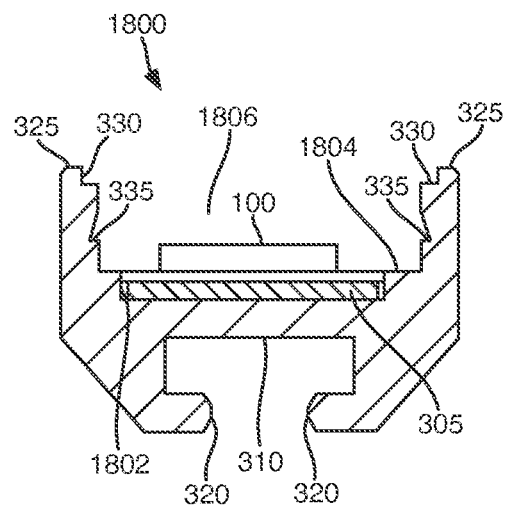
FIG. 18 is a cross-sectional view of a linear light fixture according to another embodiment of the invention.

FIG. 18 is a cross-sectional view of an extrusion, generally indicated at 1800, according to another embodiment of the invention. The extrusion 1800 of FIG. 18 is similar to the extrusion 300 of FIG. 3; therefore, any features not described here may be assumed to be similar or identical to those described above with respect to that extrusion.

Extrusion 1800 includes a linear, recessed groove or channel 1802 set into the bottom 1804 of the larger channel 1806 that it defines. The recessed groove 1802 is open, and has a width just greater than the width of the LED strip 100 itself. Here, with respect to the width of the channel 1802, the term "just greater" refers to a width sufficient to admit the LED strip 100 and allow it to be seated without being so great as to allow the LED strip 100 to shift within the channel 1802. The terms "about" and "approximately" refer to the fact that a dimension or characteristic need not be exact in order to achieve its purpose; the dimension or characteristic may vary according to conventional manufacturing tolerances.

In the illustrated embodiment, the depth of the recessed groove 1802 is approximately equal to the depth of the adhesive 305 and the depth of the board or substrate 105. However, the depth of the groove 1802 is not critical, so long as it provides a guide, allowing a manufacturer or installer to place the LED strip 100 consistently and linearly in the extrusion 1800.

In the illustrated embodiment, the channel 1802 is fully open; as a result, the adhesive 305 remains the means by which the LED strip 100 is secured into the extrusion 1800. However, in other embodiments, the upper sidewalls of the channel 1802 may define inwardly-extending flanges or spaced tabs that define a partial slot thick enough to accept and secure the LED board or substrate 105 but leave the LED assemblies 120 exposed.

While FIG. 18 shows the groove 1802 in extrusion 1800, a similar feature may be included in any of the extrusions or fixtures described above.

FIG. 18 thus provides a mechanical guide feature that allows one to lay the LED strip 100 straight over long distances. However, as those of skill in the art will appreciate, it may not be necessary to provide a full channel with a pair of sidewalls. In some embodiments, a single groove, ridge, or abutment on one side of the extrusion may be sufficient.

Figure 19:
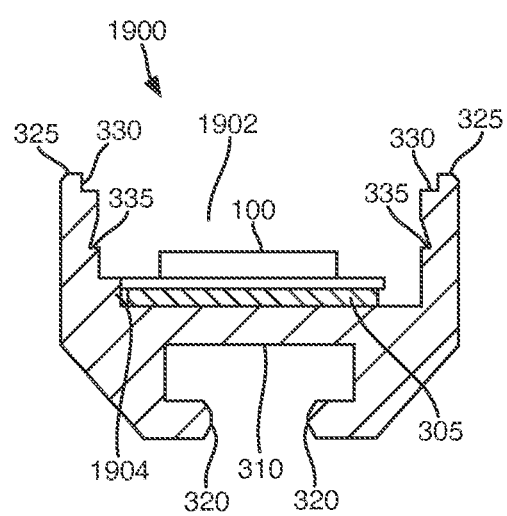
FIG. 19 is a cross-sectional view of a linear light fixture according to yet another embodiment of the invention.

As one example, FIG. 19 is an illustration of an extrusion 1900 with a large channel 1902 for an LED strip 100. The LED strip 100 sits in a slightly recessed or lower position relative to that of the extrusion 300, roughly the same position as the LED strip 100 of the extrusion 1800 of FIG. 18. However, the extrusion 1900 of FIG. 19 has only a single ridge or abutment 1904 that acts as a guide for placement of the LED strip 100; the other side is open. The ridge or abutment 1904 has a height sufficient to seat the LED strip 100 securely against it. In the illustrated embodiment, it has about the same height as the PCB substrate of the LED strip 100.

The abutment 1904 may extend into the channel 1902 as far as desired, and in particular, may have a width along the channel 1902 sufficient to center the LED strip 100 in the channel when it is laid against the abutment 1904.

The form of the mechanical guide feature is not critical, so long as it allows the LED strip 100 to be placed easily in a consistent position in the channel 1902. In some embodiments, however, it may be helpful if the guide features do not extend any farther upward than the LED strip 100 itself, and if the LED strip 100 itself is not raised any higher, so as to avoid interfering optically or mechanically with the diffuser.

CONCLUSIONS, RAMIFICATIONS, AND SCOPE

The present method and apparatus serve to house, join, and mount one or a plurality of LED light strips in an LED lighting fixture kit. A fixture comprises an extrusion that contains an LED light strip. A fixture further includes a translucent diffuser that provides a decorative cover and also diffuses light emitted by LEDs in the LED strip. A tapered wedge aligns two fixtures that are butted together end-to-end. A mounting clip has a base portion and two fingers that are shaped to springably mate with a channel on one side of the extrusion. The mounting clip is secured to a mounting surface and the channel of the extrusion is springably urged against the clip until the fingers enter the channel, thereby removably installing the lighting fixture kit.

While the above description contains many specificities, these should not be construed as limitations on the scope, but as exemplifications of some present embodiments. Many other ramifications and variations are possible using the system and methods described. For example, instead of being straight, the extrusions can be curved either laterally or longitudinally in order to remain in contact with a non-flat mounting surface. A plurality of extrusions can be joined across a gap in a mounting surface, using at least one mounting clip on either side of the gap and a tapered wedge to align butted ends of the extrusions. Extrusions, diffusers, and LEDs can be supplied in a variety of colors. Thus the scope should be determined by the appended claims and their legal equivalents, rather than the examples and particulars given.

What is claimed is:

1. An extrusion kit for LED lighting, comprising:
   at least two extrusions adapted to carry linear LED lighting, each of the at least two extrusions having
      a first, open channel defined by a first pair of opposed, generally parallel sidewalls spaced from one another with a first channel floor between and connecting the first pair of sidewalls, the first channel floor being generally flat,
      a linear, flat-bottomed guide channel recessed into a central portion of the first channel floor and extending along at least substantially the entirety of the first channel, the linear guide channel having a width and depth sufficient to accommodate and seat an LED strip flat against the bottom of the linear guide channel,
      a second channel adapted to seat connecting structures, the second channel being spaced or offset from and connected to the first channel such that the first and second channels run an entire length of the extrusion, the second channel having a second pair of opposed, generally parallel sidewalls spaced from one another with a second channel floor between and connecting the second pair of sidewalls, and
      a pair of ledges connected to respective outermost portions of the second pair of sidewalls and extending perpendicularly inwardly therefrom without meeting to define an opening for the second channel, the opening for the second channel being smaller than a width of the second channel; and
   an insert with first and second ends that tapers from a maximum width between the first and second ends to minimum widths proximate to the first and second ends, the minimum widths being less than the widths of the second channels and the maximum width being equal to or greater than the widths of the second channels such that the insert can be slid into the adjacent second channels of the at least two extrusions to join the extrusions in an abutted, press-fit connection.

2. The extrusion kit of claim 1, further comprising a strip of linear LED lighting with a width just smaller than a width of the guide channels, such that it can be seated in the guide channels once the at least two extrusions are joined.

3. The extrusion kit of claim 1, wherein the first channels are opposite their respective second channels.

4. The extrusion kit of claim 1, wherein the first channels are opposite and angularly offset from their respective second channels.

5. The extrusion kit of claim 1, wherein the sidewalls of the first channels have structure adapted to receive and retain a diffuser, such that the diffuser is mounted above the LED lighting.

6. The extrusion kit of claim 1, wherein the insert comprises a double-tapered wedge.

7. The extrusion kit of claim 1, further comprising one or more mounting clips adapted to engage the respective second channels to mount the at least two extrusions.

8. The extrusion kit of claim 7, wherein each of the one or more mounting clips has a base and a plurality of flat and flexible members having a main portion extending away from said base and in generally parallel relation.

9. An extrusion kit for LED lighting, comprising:
   at least two extrusions adapted to carry linear LED lighting, each of the at least two extrusions having
      a first, open channel defined by a first pair of opposed, generally parallel sidewalls spaced from one another with a first channel floor between and connecting the first pair of sidewalls, the first channel floor being generally flat,
      a raised ridge or abutment on the first channel floor and extending along at least substantially the entirety of the first channel,
      a second channel adapted to seat connecting structures, the second channel being spaced or offset from and connected to the first channel such that the first and second channels run an entire length of the extrusion, the second channel having a second pair of opposed, generally parallel sidewalls spaced from one another with a second channel floor between and connecting the second pair of sidewalls, and
      a pair of ledges connected to respective outermost portions of the second pair of sidewalls and extending perpendicularly inwardly therefrom without meeting to define an opening for the second channel, the opening for the second channel being smaller than a width of the second channel; and
   an insert with first and second ends that tapers from a maximum width between the first and second ends to minimum widths proximate to the first and second ends, the minimum widths being less than the widths of the second channels and the maximum width being equal to or greater than the widths of the second channels such that the insert can be slid into the adjacent second channels of the at least two extrusions to join the extrusions in an abutted, press-fit connection.

10. The extrusion kit of claim 9, further comprising a strip of linear LED lighting adapted to be applied to the floors of the first channels, positioned against the ridge or abutment.

11. The extrusion kit of claim 9, wherein the first channels are opposite their respective second channels.

12. The extrusion kit of claim 9, wherein the first channels are opposite and angularly offset from their respective second channels.

13. The extrusion kit of claim 9, wherein the sidewalls of the first channels have structure adapted to receive and retain a diffuser, such that the diffuser is mounted above the LED lighting.

14. The extrusion kit of claim 9, wherein the insert comprises a double-tapered wedge.

15. The extrusion kit of claim 9, further comprising one or more mounting clips adapted to engage the respective second channels to mount the at least two extrusions.

16. The extrusion kit of claim 15, wherein each of the one or more mounting clips has a base and a plurality of flat and flexible members having a main portion extending away from said base and in generally parallel relation.

17. An extrusion kit for LED lighting, comprising:
   at least two extrusions adapted to carry linear LED lighting, each of the at least two extrusions having
      a first, open channel defined by a first pair of opposed, generally parallel sidewalls spaced from one another with a first channel floor between and connecting the first pair of sidewalls, the first channel floor being generally flat,
      a second channel adapted to seat connecting structures, the second channel being spaced or offset from and connected to the first channel such that the first and second channels run an entire length of the extrusion, the second channel having a second pair of opposed, generally parallel sidewalls spaced from one another with a second channel floor between and connecting the second pair of sidewalls, and a pair of ledges connected to respective outermost portions of the second pair of sidewalls and extending perpendicularly inwardly therefrom without meeting to define an opening for the second channel, the opening for the second channel being smaller than a width of the second channel; and an insert with first and second ends that tapers from a maximum width between the first and second ends to minimum widths proximate to the first and second ends, the minimum widths being less than the widths of the second channels and the maximum width being equal to or greater than the widths of the second channels such that the insert can be slid into the adjacent second channels of the at least two extrusions to join the extrusions in an abutted, press-fit connection.

18. The extrusion kit of claim 17, further comprising a strip of linear LED lighting adapted to be applied to the floors of the first channels.

19. The extrusion kit of claim 17, wherein the first channels are opposite their respective second channels.

20. The extrusion kit of claim 17, wherein the first channels are opposite and angularly offset from their respective second channels.

21. The extrusion kit of claim 17, wherein the sidewalls of the first channels have structure adapted to receive and retain a diffuser, such that the diffuser is mounted above the LED lighting.

22. The extrusion kit of claim 17, wherein the insert comprises a double-tapered wedge.

* * * * *